United States Patent [19]

Kitagawa

[11] Patent Number: 5,255,050
[45] Date of Patent: Oct. 19, 1993

[54] PROJECTION EXPOSURE METHOD

[75] Inventor: Tetsuya Kitagawa, Kanagawa, Japan

[73] Assignee: Sony Corporation, Tokyo, Japan

[21] Appl. No.: 802,377

[22] Filed: Dec. 4, 1991

[30] Foreign Application Priority Data

Dec. 6, 1990 [JP] Japan .................. 2-405362

[51] Int. Cl.⁵ ............................................ G03B 27/42
[52] U.S. Cl. ........................................ 355/53; 355/77; 430/397
[58] Field of Search .............. 355/53, 77, 68, 69; 430/397, 394, 494

[56] References Cited

U.S. PATENT DOCUMENTS

| | | | |
|---|---|---|---|
| 4,239,790 | 12/1980 | Bösenberg | 427/54.1 |
| 4,869,999 | 9/1989 | Fukuda et al. | 430/397 X |
| 4,904,569 | 2/1990 | Fukuda et al. | 355/55 X |
| 4,937,619 | 6/1990 | Fukuda et al. | 355/53 |

FOREIGN PATENT DOCUMENTS 58-17446  2/1983  Japan .
63-64037  3/1988  Japan .

*Primary Examiner*—D. Rutledge
*Attorney, Agent, or Firm*—Hill, Steadman & Simpson

[57] ABSTRACT

For projecting a photomask pattern on a wafer using a projection optical system having a short wavelength light source and a high numerical aperture, a method for projection exposure is proposed, by which a focal margin may be improved to achieve stable resolution and improved throughput. It is assumed for example that three-stage sequential light exposure is performed by setting an image plane at three positions, namely at a center focal position which is a mean height position of highs and lows of the wafer surface step difference and plus and minus focal positions offset a predetermined amount on each side of the center focal position. If light exposure is performed at each of these positions with an exposure light volume equal to one-third of the total exposure light volume, the focus margin becomes smaller than that in the case of the two-stage light exposure. By using a relatively small exposure light volume at the center focal position according to the present invention, the focal margin may be enlarged, although the synthesized light intensity contrast becomes minimum at the center focal position. The same effect may also be achieved by continuous light exposure with the constant exposure light volume using a relatively high speed of movement of the image plane at the center focal position for improving the throughput.

8 Claims, 5 Drawing Sheets

PROJECTION EXPOSURE METHOD

BACKGROUND OF THE INVENTION

1. Field of the Invention

This invention relates to a method for projection exposure applied to photolithography for preparation of semiconductor devices. More particularly, it relates to a method for exposure projection which allows for uniform resolution over an entire wafer surface.

2. Description of Related Art

In the field of semiconductor integrated circuits, submicron size processing has already been realized in mass-producing plants, while researches are currently conducted on half-micron size processing and even on quarter-micron size processing which is thought to be indispensable in 64 Mbit level DRAMs.

The technology which has played a key role in the progress of ultra-fine processing is photolithography. The progress so far achieved in ultra-fine processing owes much to reduction in exposure wavelengths of the exposure light and an increase in the numerical aperture (NA) of optical lenses of a stepper. However, the reduction in the exposure light wavelengths and the increase in the numerical aperture are not desirable from the viewpoint of increasing the depth of focus, because the depth of focus is proportionate to the wavelength of exposure light and inversely proportional to the second power of numerical aperture.

On the other hand, the surface step difference of a semiconductor wafer as a member to be exposed tends to be increased recently with increase in the density of semiconductor integrated circuits. The reason therefore is that, for the sake of maintenance of circuit performance and reliability under the current tendency towards a three-dimensional device construction, reduction in the three-dimensional design rule is not progressing smoothly as compared to that in the two-dimensional design rule. If the surface of a semiconductor wafer presenting larger step differences is coated with a photoresist material to form a photoresist layer, larger step differences or fluctuations in film thicknesses are similarly produced in the so-formed photoresist layer. As to the step differences produced over finer patterns, the wafer surface was smoothed by a multilayer resist method. However, a step difference produced over a wider area, such as a step produced between memory cells and peripheral circuits, can not be compensated with the multilayer resist method. If such wafer is to be exposed to light, the position of an image plane can not but be selected to be a mid position between highs and lows of the step difference. In addition, the image plane can not be a completely flat plane due to distortion of the image plane of a projecting lens, while the wafer surface can not be completely normal to an optical axis of the projecting optical system.

Under these circumstances, and also as a result of increased light absorption of the photoresist material caused by use of shorter wavelengths, difficulties are raised in achieving uniform resolution on an entire wafer surface.

Thus the requirements for resolution and those for depth of focus are essentially contradictory to each other. For combatting this problem, researches are being conducted for developing techniques for achieving high contrast and hence high resolution through special artifices and methods for using an exposure device on the premise that the numerical aperture is suppressed to a predetermined level and a practically useful level of depth of focus is maintained.

Among these techniques is a so-called FLEX method, according to which, as disclosed in JP Patent KOKAI (Unexamined) Publication No. 58/17446 (1983), a number of light exposure operations is carried out while the image plane is shifted through the same photomask for effectively maintaining optical image contrast extended along the optical axis. For shifting the image plane, at least one of the photomask, semiconductor wafer or the projecting optical system is wobbled along the optical axis, as disclosed in the above mentioned Publication, or shifted stepwise or continuously each time light exposure is performed, as disclosed in JP Patent KOKAI Publication No. 63/64037 (1988).

The simplest FLEX method is a two-stage method having two different points on the optical axis as positions for the image plane. Referring to FIG. 1, an example in which the image plane is shifted along the optical axis (Z axis) by vertically driving a wafer-setting Z stage is hereinafter explained.

In this figure, the stage position (in $\mu$m) along the Z axis is plotted on the horizontal axis. This stage position is defined as an offset (focal offset) from a reference point which is the position of the image plane set at a mean height position between the highs and lows of the step difference of the wafer (center focal position) as a point of origin. The direction proceeding towards a light source and that away from the light source are termed the minus (−) direction and the (+) direction, respectively, while the position of the image plane in which the wafer is shifted in the (−) direction and that in which the wafer is shifted in the (+) direction are termed the minus (−) focal position and the plus (+) focal position, respectively. The contrast in light intensities is plotted on the vertical axis. Two solid lines e and f represent contrasts in light intensities when projection light exposure is performed with the same volume of light exposure with the image plane having been shifted −1.0 $\mu$m and +1.0 $\mu$m from the point of origin, respectively. A broken line g represents contrasts of light intensities obtained by synthesizing the curves e and f. Although the light intensity contrast strictly is not in linearly correlated with the volume of light exposure, it is assumed herein to correspond approximately to the volume of light exposure for convenience.

In order for the pattern to be dissolved satisfactorily on the entire surface of the wafer, a light intensity contrast higher than a predetermined level need to be maintained within a predetermined extent along the optical axis as determined by the step difference of a wafer surface, distortion of an imaging surface of a projecting lens, tilt of the wafer or the like. If it is assumed that an appropriate extent of the light intensity contrast corresponding to a practically sufficient resolution is 0.5 to 0.8 and the range along the Z axis with which such range of the light intensity contrast is achieved is defined as a focal margin, the focal margin as viewed on the synthesized light intensity contrast shown by the broken line g is approximately 1.2 $\mu$m along the (−) and (+) directions, or 2.4 $\mu$m in sum, as shown by ranges $B_1$ and $B_2$. However, the synthesized light intensity contrast becomes lower than 0.5 in the vicinity of the center focul position so that stable resolution can not be achieved. The result is that inconveniences such as fluctuations in contact hole diameters, for example, are produced.

On the other hand, a three-stage method has also been proposed, in which light exposure at the center focal position is additionally performed in the above mentioned two-stage method. This alternative method is hereinafter explained by referring to FIG. 2.

In an example, shown in FIG. 2, light exposure is performed not only at the focal offsets at ±1.0 μm, but also at the center focal position. Thus, in FIG. 2, three solid lines h, i and j represent light intensity contrast curves when projection light exposure is performed with the same volume of light exposure with the focal offsets of −1.0 μm, 0 μm and +1.0 μm, respectively. A broken line k represents a light intensity contrast curve obtained by synthesis of three curves h, i and j. It is noted that, since the total volume of light exposure is the same as that with the above mentioned two-stage method, the volume of light exposure for one light exposure operation is less than that in the case of the two-stage method.

With this technique, the focal margin as seen on the synthesized light intensity contrast curve shown by the broken line k is obtained as a continuous range which, as shown by a range C in FIG. 2, in contrast to the two-stage method, meaning that instability in the vicinity of the center focal position has now been eliminated.

However, the focus margin with the above mentioned three stage method is about 2.2 μm, as shown in FIG. 2, which is less than that obtained with the two-stage method shown in FIG. 1. Thus the merit proper to the three-stage method may not be said to be functioning satisfactorily.

OBJECT AND SUMMARY OF THE INVENTION

It is therefore an object of the present invention to provide a projection exposure method comprising setting the image plane in three or more stages in effecting light exposure, whereby not only the focal margin may be enlarged but also the throughput may be improved.

The reason the focal margin is decreased with the conventional three-stage method as compared with that with the two-stage method is that, as a result of dividing the total volume of light exposure into three equal parts, the light intensity contrast is decreased in its entirety, above all, it is decreased most acutely at both ends of the range of shifting of the image plane. The present inventor has directed attention to the fact that the light intensity contrast is improved in the vicinity of the center focal position in the case of the curve for the synthesized light intensity contrast shown by broken line k in FIG. 2, and arrived at a notion that, if the volume of light exposure in this region is partially distributed to the minus focal and plus focal sides, the focal margin may be enlarged in its entirety, even although the profile of the curve should be decreased to a minimum value near the center focal position. It is on the basis of this concept that, in effecting light exposure by setting three or more positions for the image plane in accordance with the present invention, the volume of light exposure is reduced relatively in the vicinity of the center of the setting range of the image plane.

However, with sequential light exposure in which it is necessary to perform stage movement and stop, shutter opening and closure and increase or decrease of the light exposure power, throughput can not be improved beyond a certain threshold value. In this consideration, the present invention further proposes a method comprising moving at least one of the projecting optical system, photomask and the wafer along the optical axis with a speed distribution depending on the position of the image plane along the optical axis. With the proposed method, the volume of light exposure is decreased and increased in regions of higher and lower speeds, respectively, even if the volume of light exposure is constant and the shutter is perpetually in the open condition. If it is desired to decrease the volume of light exposure in the vicinity of the center focal position, it suffices to increase the speed of one of the optical system, photomask and the wafer in the vicinity of the center focal position. As a result, the number of parameters to be controlled is decreased and the throughput markedly improved as compared with those with the conventional multi-stage light exposure system.

It will be seen from above that, in accordance with the present invention, the focal margin may be enlarged by relatively decreasing the volume of light exposure in the vicinity of the center focal position. On the other hand, throughput may also be improved by an ingenuous artifice of gradating the speeds of movement along the Z axis of the unit(s) capable of moving the image plane.

Thus the present invention has a significant practical merit under the situation of the decreased depth of focus as a consequence of the use of shorter wavelengths of the exposure light and the higher numerical aperture.

BRIEF DESCRIPTION OF THE DRAWINGS

FIGS. 4a to 4c are schematic cross-sectional views showing an example of position setting of an image plane in case the present invention is applied to a three-stage method, wherein FIG. 4a shows the minus focal position, FIG. 4b shows the center focal position and FIG. 4c shows the plus focal position.

DETAILED DESCRIPTION OF THE INVENTION

Figure 1:
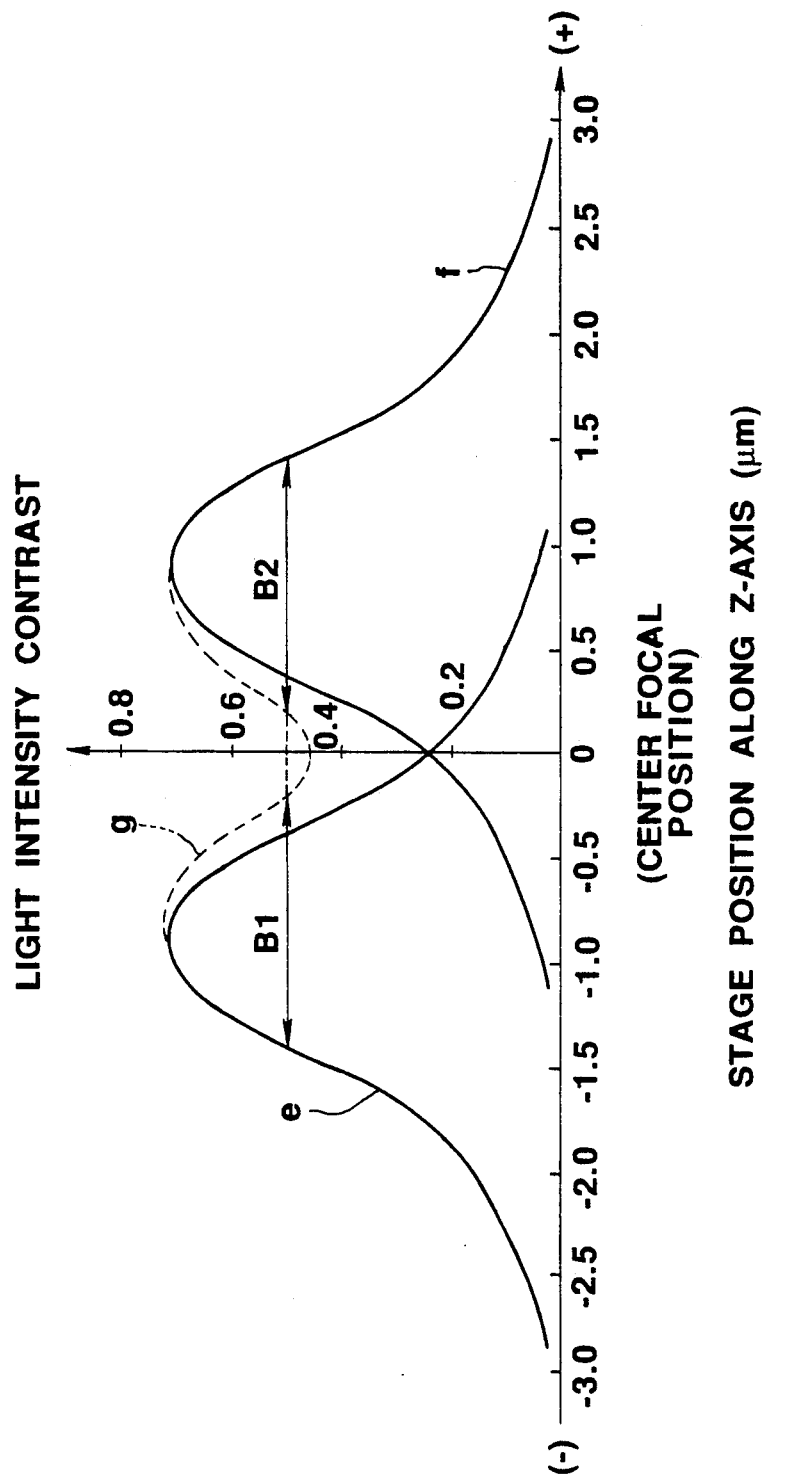
FIG. 1 is a graph showing light intensity contrast curves with the conventional two-stage method.

Referring to the drawings, certain preferred embodiments of the present invention will be explained in detail.

EXAMPLE 1

In the present example, the present invention is applied to a three-stage method, and the image plane is moved by raising and lowering the wafer.

Figure 3:
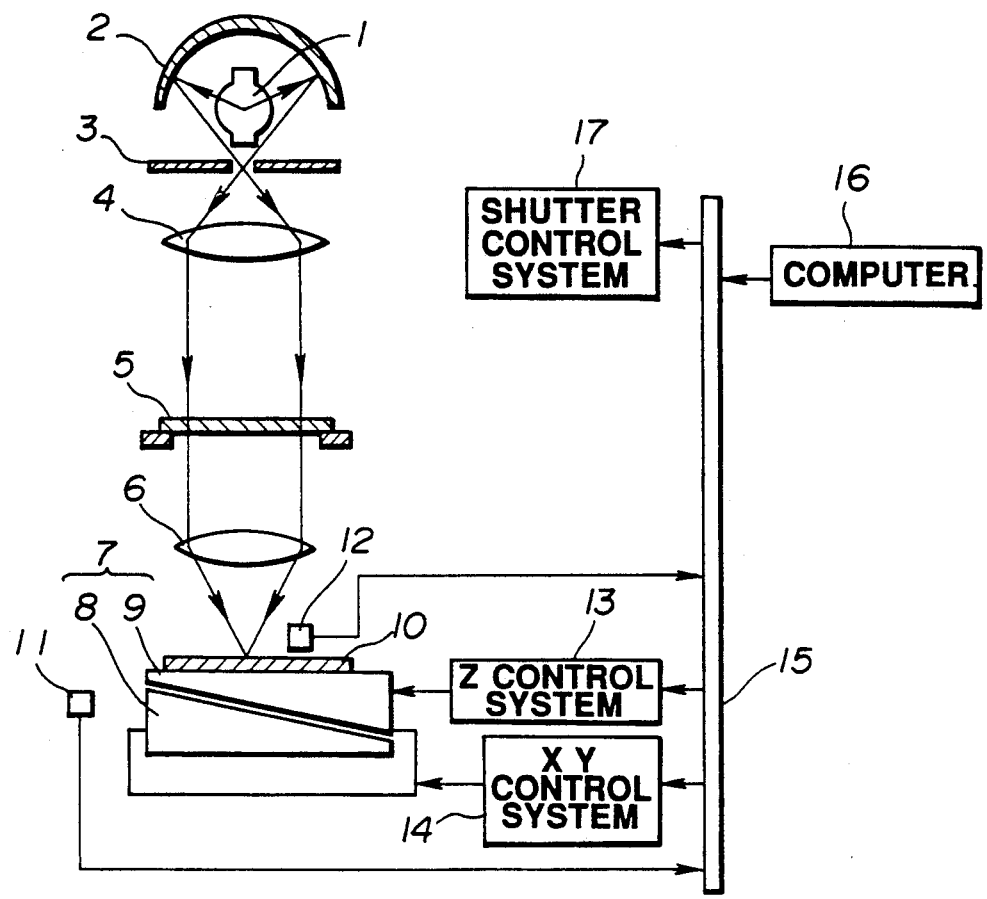
FIG. 3 is a schematic view showing an example of construction of a projection light exposure device employed for practicing the invention.

FIG. 3 shows a schematic structure of a projection optical system and a control system of a projection exposure device employed in the present example.

With the projection optical system, the light radiated from a light source 1 is reflected and converged by a reflective mirror 2 to fall via an aperture 3 on a collimator lens 4 whereby it is collimated and then transmitted through a photomask 5 so as to be projected by an imaging lens 6 on a wafer 10 placed on a wager stage 7. The wafer stage 7 is composed of an XY stage 8 for shifting the wafer 10 in its in-plane direction or XY direction and a Z stage 9 for shifting the wafer along the optical axis or Z axis. The wafer 10 may be moved to a designated position three-dimensionally by the combination of the movements of the stages 8 and 9.

The control system is made up of a shutter control system 17 for controlling the timing of light exposure, an XY control system 14 for driving the XY stage 8 to a designated position, an XY sensor 11 for detecting the relative position of the wafer 10 in the XY plane, a Z control system 13 for driving the Z stage 9 to its designated position, a Z sensor 12 for detecting the relative position of the wafer 10 in the Z axis direction, a computer 16 for collectively controlling the light exposure device in its entirety and a bus line for interconnecting the control systems 13, 14 and 17 with the computer 16. In this computer, the light exposure position in the XY plane on the wafer 10, the number of the image planes set for the respective light exposure positions in the XY plane, the amount of movement of the Z stage 9 and the volume of light exposure for the image plane in each of the light exposure positions etc. are stored previously. The control systems 13, 14 and 17 receive various signals generated on the basis of the information stored in the computer 16 over bus line 15 to perform prescribed control operations.

Figure 4A:
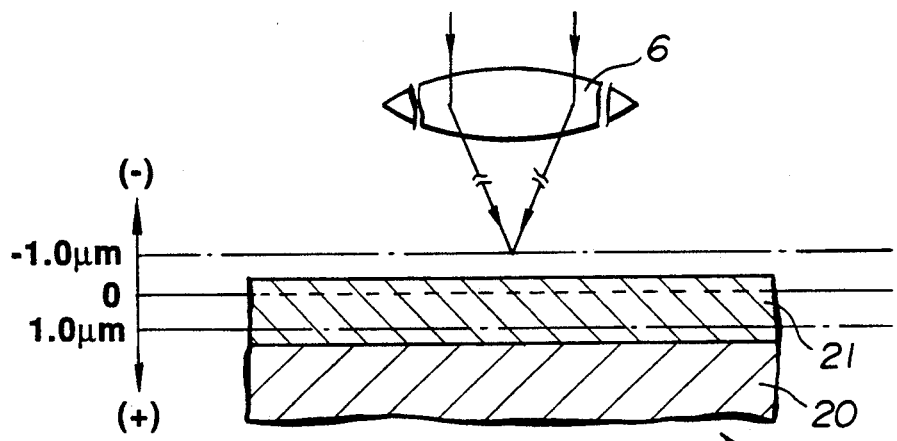
Figure 4B:
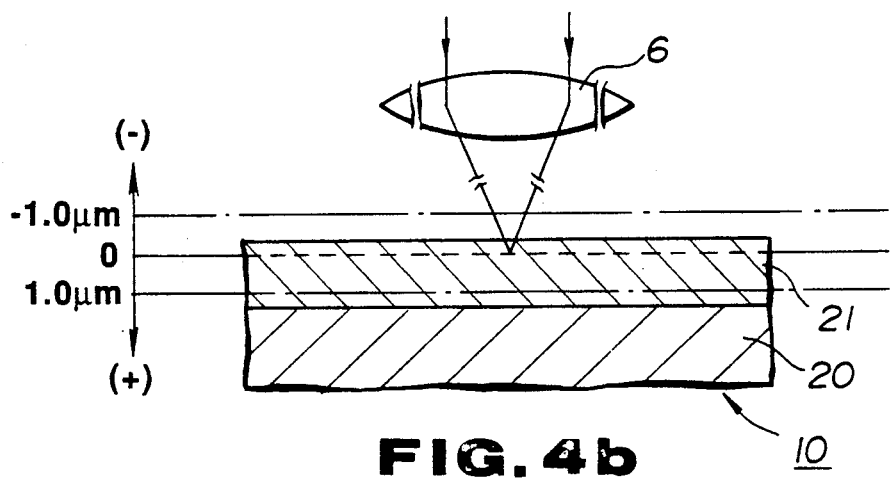
Figure 4C:
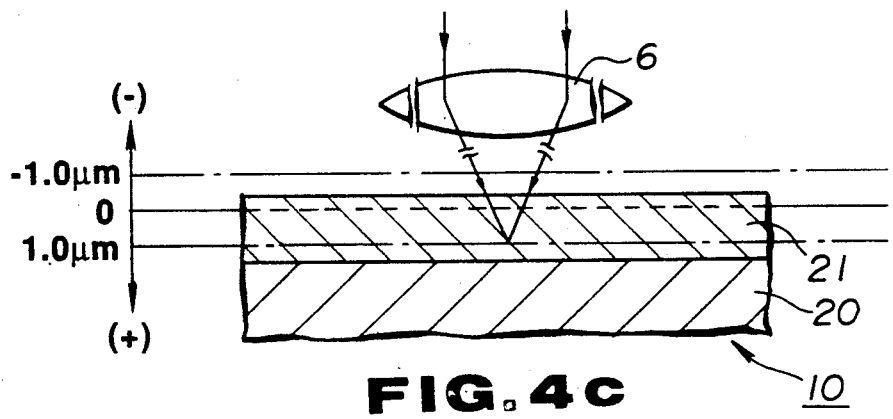

In FIGS. 4a to 4c, the manner in which the image plane is moved for light exposure in accordance with the three-stage method is shown schematically.

In these figures, light exposure is performed while the image plane is moved within an extent of ±1 μm with respect to the wafer 10 comprised of a photoresist layer 21 formed on a substrate 20 formed of a predetermined layer of material. It is noted that warping of the wafer 10, surface step differences of the photoresist layer 21 or distortions of the image plane caused by aberrations of the projection optical system, generated in a region, not shown, are substantially contained within this extent of movement of 2 μm. The coordinate system data entered in the figures are intended for aiding in the understanding of the movement of the image plane along the z axis (focal offsetting). Thus the origin O denotes a mid point of the extent of the movement, the minus (−) direction is the direction of approaching the imaging lens 6 and the plus (+) direction denotes the direction of moving away from the imaging lens 6. FIG. 4a shows the minus focal position with the focal offset of −1.0 μm, FIG. 4b shows the center focal position with the focal offset of 0 μm and FIG. 4c shows the plus focal position with the focal offset of +1.0 μm.

The following is the sequence of effecting light exposure by the three-stage method using the above described projection light exposure device.

The method described below is a method for light exposure known as a step-and-repeat system. After the XY control system 14 has moved the XY stage 8 to a predetermined position under the commands from the computer 16, the Z control system 13 actuates the Z stage 9 to uplift the wafer 10 to a position corresponding to −1.0 μm of the focal offset, as shown in FIG. 4a. The relative position of the wafer 10 is fed back to the XY control system 14 and the Z control system 13 by means of the XY sensor 11 and the Z sensor 12 so as to be corrected automatically if necessary. A shutter, not shown, is opened under the commands of the shutter control system 17 to effect light exposure with a predetermined exposure light volume. After the end of light exposure, the shutter is closed and the Z stage 9 is actuated for lowering the wafer 10 to the center focal position shown in FIG. 4b where light exposure is again performed by the same sequence of operations as described above. After the end of the second light exposure, the wafer 10 is further lowered to a position corresponding to the focal offset of +1.0 μm, as shown in FIG. 4c, where light exposure is again performed by the same sequence of operations.

It is noted that, at the time of light exposure near the center focal position, among the above described three light exposure operations, the exposure light volume is decreased as compared to that at the time of the light exposure at the plus and minus focal offset positions. This is shown by light intensity contrast curves shown in FIG. 5, in which three solid lines a, b and c represent the light intensity contrast curves corresponding to the focal offsets of −1.0 μm, 0 μm and +1.0 μm, respectively. It is noted that the volume of light exposure at the focal offsets of ±1.0 μm is selected to be slightly smaller than that with the two-stage method shown in FIG. 1, with the decreased volume of exposure light being distributed and supplemented to the exposure light volume at the center focal position. A light intensity contrast curve shown by a broken line d is obtained by synthesizing these three curves together.

Figure 2:
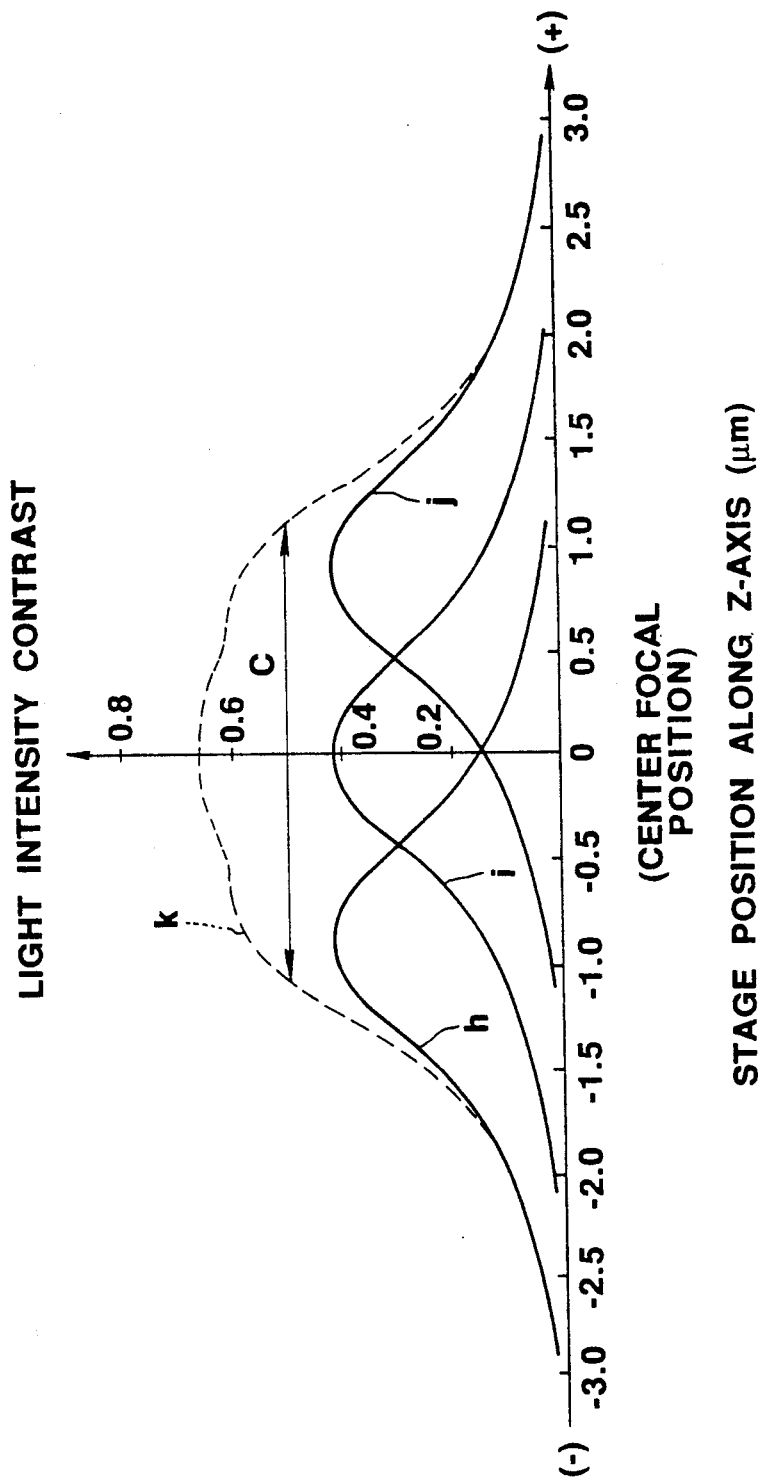
FIG. 2 is a graph showing light intensity contrast curves with the conventional three-stage method.
Figure 5:
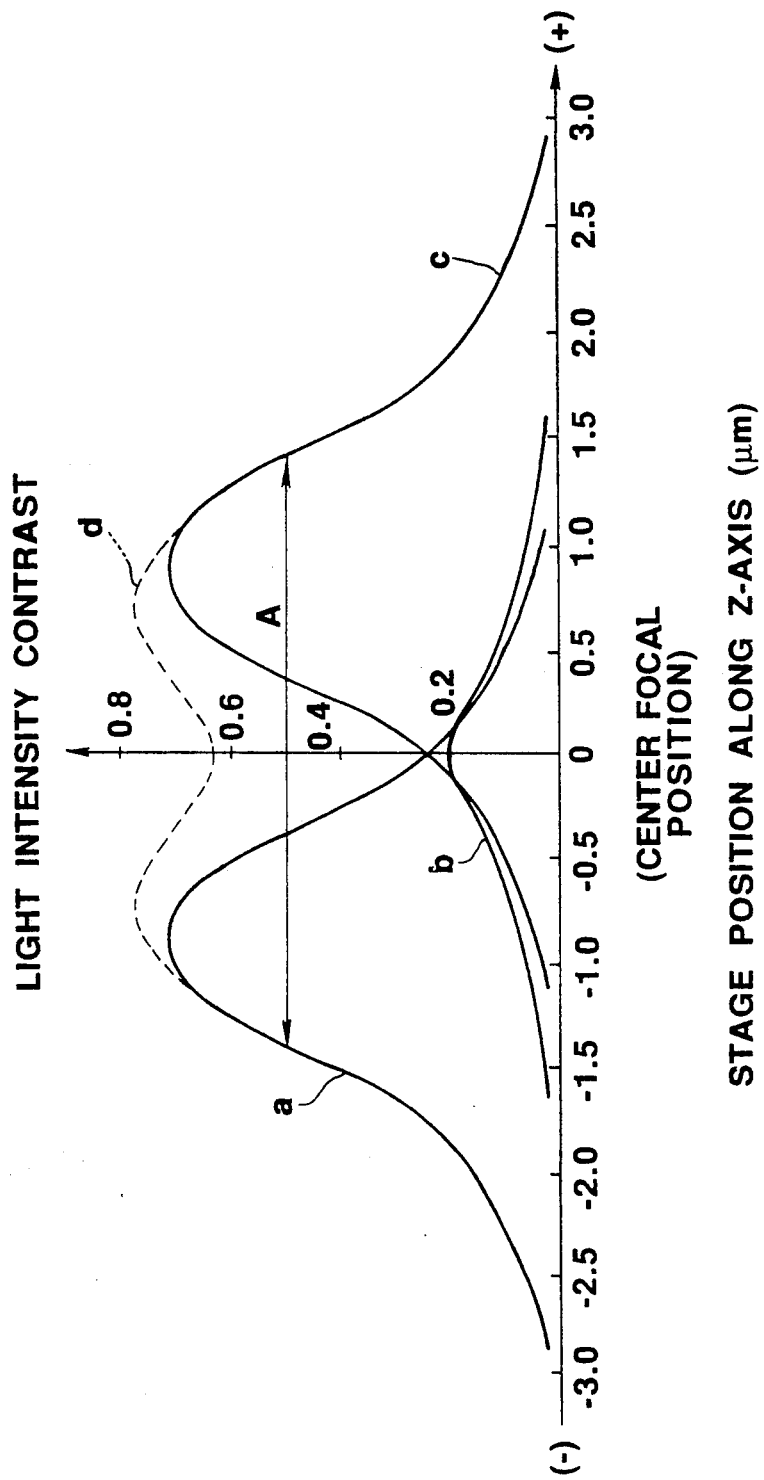
FIG. 5 is a graph showing light intensity contrast curves obtained on application of the present invention to a three-stage method.

By such light exposure, a continuous focal margin extending about 2.8 μm is achieved, as shown at a range A in FIG. 5, due to the fact that the drop of the light intensity contrast in the vicinity of both ends of the extent of the Z stage movement as shown in FIG. 2 is suppressed, while that in the vicinity of the center focal position as shown in FIG. 1 is reduced.

It is noted that, although the three-stage light exposure is started in the above explanation from the minus focus side, it may also be started from the plus focus side without any inconvenience.

It is also noted that, although the image plane is set in the above embodiment at three prescribed positions on the XY plane, the present invention is not limited to this embodiment, but may be applied to cases of setting the image plane at four or more positions. In these cases, it becomes necessary to optimize the distribution of the exposure light volume depending on the number of the setting positions of the image plane. To this end, it suffices to decrease the exposure light volume at the center focal position relatively for odd-numbered setting positions for the image plane and at least two positions on both sides of the center focal position for even-numbered setting positions for the image plane.

EXAMPLE 2

In the present example, the efficiency of the light exposure operation is improved further as compared to that achieved with the preceding example 1.

Figure 6:
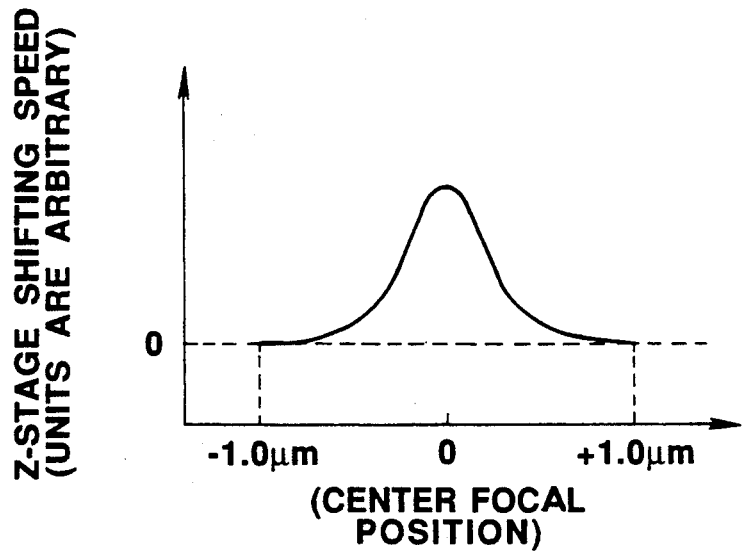
FIG. 6 is a graph showing a pattern of gradation of the speed of movement of the Z stage on application of the present invention.

The construction of the wafer 10 and the projection light exposure device employed in the present example 1 as well as the extent of movement of the image plane is the same as that described in example. However, the operation of light exposure is not performed herein by the above mentioned step-and-repeat system, but, with the shutter in the perpetually opened state, the speed of movement of the Z stage is changed in accordance with a pattern shown for example in FIG. 6. That is, the speed of movement of the Z stage was set so that it is rather small in the vicinity of ±1.0 μm offsets and increased as the Z stage approaches to the center focal position, becoming maximum at the center focal position. In this case, the above mentioned pattern of speed change or gradation need to be stored in the computer 16 instead of the number of setting positions of the image plane.

Under such setting, if the exposure light power is constant, the volume of light exposure is proportionate to the light exposure time, which in turn is inversely proportionate to the stage shifting speed. Thus the volume of light exposure becomes maximum and minimum in the vicinity of the center focal position $\pm 1.0$ μm and in the vicinity of the center focal position, respectively, so that a pattern of changes or gradations of the exposure light volume approximately similar to that of FIG. 5 is achieved. The changes or gradations of the exposure light volume may naturally be combined in any desired manner with those of the shifting speed of the Z stage 9.

With the present method, the image plane may be moved continuously without intermediate stopping, while only one light exposure operation at one of the light exposure positions on the XY plane suffices. The result is that the time consumed in the movement and stopping of the Z stage 9 or shutter opening and closure may be saved so that throughput may be improved significantly.

What is claimed is:

1. A method for projection exposure of projecting a photomask pattern on a wafer by a projection optical system comprising setting an image plane of said pattern on said wafer at three or more positions along the optical axis of said optical system within a predetermined extent, and carrying out light exposure operations sequentially at these positions so that the exposure light volume at near the mid point of said extent is smaller than that at both ends of said extent.

2. The method as claimed in claim 1 wherein setting of said image plane is performed by driving said projection optical system.

3. The method as claimed in claim 1 wherein setting of said image plane is performed by driving said photomask.

4. The method as claimed in claim 1 wherein setting of said image plane is performed by driving said wafer.

5. A method for projection exposure of projecting a photomask pattern on a wafer by a projection optical system comprising shifting an image plane of said pattern on said wafer along the optical axis of said optical system within a predetermined extent, and continuously carrying out light exposure operations so that the shifting speed of said image plane at near the mid point of said extent is larger than that at both ends of said extent.

6. The method as claimed in claim 5 wherein shifting of said image plane is performed by driving said projection optical system.

7. The method as claimed in claim 5 wherein shifting of said image plane is performed by driving said photomask.

8. The method as claimed in claim 5 wherein shifting of said image plane is performed by driving said wafer.

* * * * *